United States Patent [19]

Cogan

[11] Patent Number: 4,477,963
[45] Date of Patent: Oct. 23, 1984

[54] METHOD OF FABRICATION OF A LOW CAPACITANCE SELF-ALIGNED SEMICONDUCTOR ELECTRODE STRUCTURE

[75] Inventor: Adrian I. Cogan, Waltham, Mass.

[73] Assignee: GTE Laboratories Incorporated, Waltham, Mass.

[21] Appl. No.: 467,406

[22] Filed: Feb. 17, 1983

Related U.S. Application Data

[62] Division of Ser. No. 219,473, Dec. 23, 1980, abandoned.

[51] Int. Cl.³ .................. H01L 29/46; H01L 29/76
[52] U.S. Cl. ........................... 29/571; 29/578; 148/174; 357/22
[58] Field of Search ............. 29/571, 578; 148/174; 357/22, 59, 68; 156/591, 657, 661

[56] References Cited

U.S. PATENT DOCUMENTS

| | | | |
|---|---|---|---|
| 3,936,331 | 2/1976 | Luce et al. | 357/59 |
| 4,141,023 | 2/1979 | Yamada | 357/59 |
| 4,151,019 | 4/1979 | Tokumaru et al. | 29/578 |
| 4,175,317 | 11/1979 | Aoki et al. | 29/578 |
| 4,352,238 | 10/1982 | Shimbo | 29/571 |

*Primary Examiner*—Brian E. Hearn
*Assistant Examiner*—Hunter L. Auyang
*Attorney, Agent, or Firm*—J. Stephen Yeo

[57] ABSTRACT

Semiconductor electrode structure with low parasitic capacitance and method for forming low capacitance first and second electrodes in a semiconductor device, such as a static induction transistor, while avoiding the requirement for precision mask alignment and mask to mask registration. During formation of electrode contacts, the first electrodes are protected by silicon nitride and a low resistivity silicon layer is grown over the semiconductor wafer, forming epitaxial regions over the second electrodes of a polycrystalline region over protected portions of the wafer. The silicon layer is selectively etched by a mixture which removes the polycrystalline region but does not appreciably affect the epitaxial regions. Second electrode metallic contacts are made in enlarged regions of the second electrodes where mask alignment is not critical. The reduction in contact window overlap by metallic contacts reduces parasitic capacitance.

4 Claims, 11 Drawing Figures

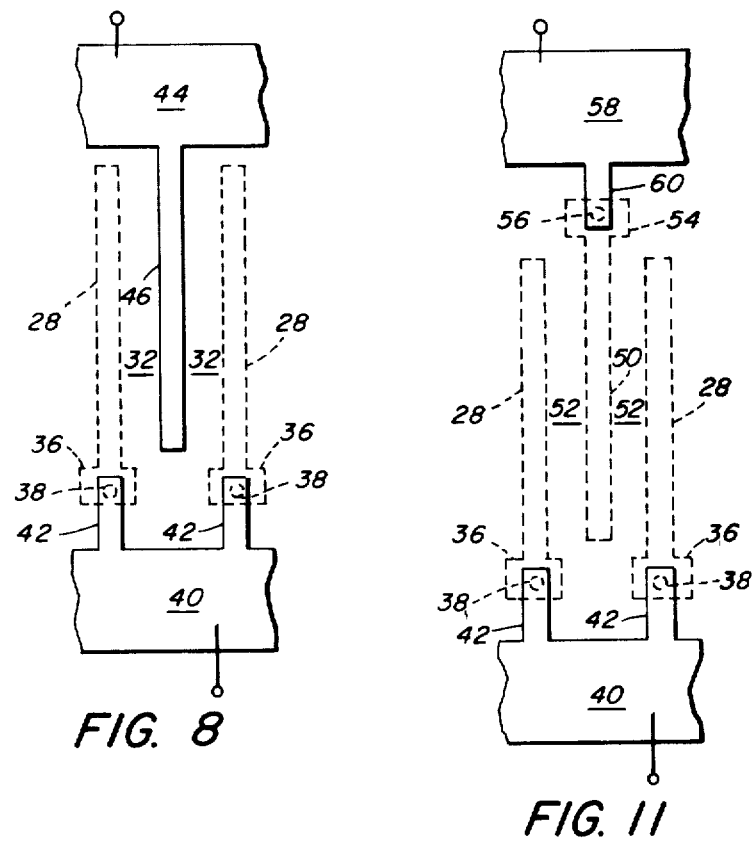
FIG. 8
FIG. 11
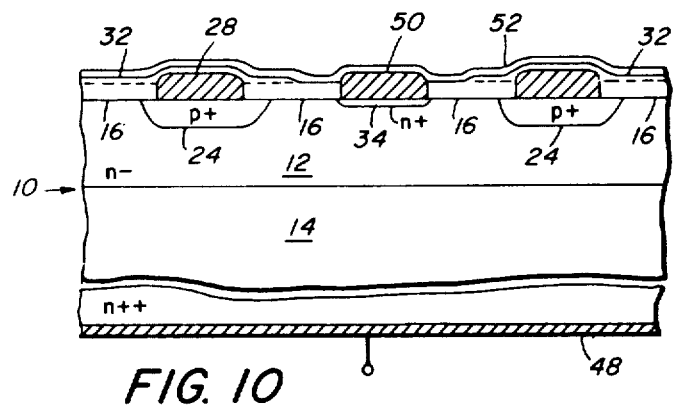
FIG. 10

METHOD OF FABRICATION OF A LOW CAPACITANCE SELF-ALIGNED SEMICONDUCTOR ELECTRODE STRUCTURE

This is a division of application Ser. No. 219,473 filed Dec. 23, 1980, now abandoned.

BACKGROUND OF THE INVENTION

This invention relates to high frequency semiconductor devices and, more particularly, to an electrode structure with low parasitic capacitance and a method for fabricating low capacitance electrodes in a semiconductor device while avoiding the requirement for precision mask alignment.

Semiconductor devices designed for high frequency operation require electrodes having extremely small dimensions and must be fabricated under extremely tight dimensional control to minimize stray capacitance and series resistance. Devices designed for operation at or above one gigahertz utilize electrode widths of one or two microns and electrode separations of a few microns. Photolithographic alignment and mask to mask registration, therefore, requires a precision of a few tenths of a micron. Such requirements make processing of high frequency semiconductor devices costly and difficult.

One example of a device requiring precision alignment and mask to mask registration is the static induction transistor, a field effect device which exhibits excellent high power and high frequency capabilities. The static induction transistor (SIT) typically utilizes a vertical geometry. Source and drain contacts are placed on opposite sides of a thin, high-resistivity layer of one conductivity type. Gate regions of the opposite conductivity type are diffused into the high resistivity layer on opposite sides of the source. Gate and source widths are typically 1.5 microns while the gate to source spacing is typically 5 microns. A slight mask misalignment can result in short-circuited semiconductor devices or can degrade device performance. Furthermore, the parasitic capacitance associated with metallic contact overlap degrades device performance. It is, therefore, desirable to provide an electrode structure in which the parasitic capacitance associated with metallic contact window overlap is reduced and to provide a method for fabricating low capacitance electrodes in semiconductor devices while avoiding the requirement for precision mask alignment and mask to mask registration.

SUMMARY OF THE INVENTION

According to the present invention there is provided a method for forming self-aligned first and second electrodes in a semiconductor device while avoiding the requirement for precision mask alignment and mask to mask registration. A first oxide layer is grown on a silicon semiconductor wafer in which the first and the second electrodes are to be formed. First and second windows are opened in the first oxide layer. A protective silicon nitride layer is deposited in the first window. The semiconductor wafer is doped with impurities through the second window, thereby forming the second electrode. A silicon layer of the same conductivity type as the second electrode is grown over the wafer. The silicon layer grows as a low resistivity monocrystalline region over the second electrode and as a polycrystalline region over the remainder of the wafer. The wafer is exposed to a first etching solution which removes the polycrystalline region but which has little effect on the monocrystalline region. A second oxide layer is grown on the wafer in a low temperature, high-pressure process. The wafer is then exposed to a second etching solution which removes the silicon nitride layer from the first window without affecting the oxide layers. The semiconductor wafer is doped with impurities through the first window thereby forming the first electrode. A contact window is opened through the second oxide layer to the monocrystalline region. Finally, metal is patterned and deposited over the contact window and the first electrode for making electrical contact to the first and second electrodes. The silicon layer is typically grown in an epitaxial reactor by chemical vapor deposition. One example of a semiconductor device to which the method of the present invention is applicable is the static induction transistor.

According to another aspect of the present invention, there is provided a field effect semiconductor device having low parasitic capacitance. The device includes a high resistivity layer of semiconductor material of one conductivity type with a low resistivity source electrode formed on a first surface thereof and a low resistivity drain electrode formed on a second surface thereof. Low resistivity gate electrodes of the opposite conductivity type are formed on the first surface of the high resistivity layer on opposite sides of the source electrode. Very low resistivity monocrystalline silicon gate contacts are disposed on the gate electrodes without overlap thereof. The gate contacts have the same conductivity type as the gate electrodes and include enlarged portions to which electrical contact is made by a gate metallization. The gate and source electrodes can have the form of parallel strips in the first surface of the high resistivity layer with the enlarged portions of the gate contacts located at one end of the parallel strips.

BRIEF DESCRIPTION OF THE DRAWINGS

In the drawings:

FIG. 8 is a top view of the semiconductor wafer shown in FIG. 7 after deposition and patterning of the source and gate metallizations;

FIG. 10 is a cross-sectional view of the semiconductor wafer shown in FIG. 7 illustrating an alternative method of making electrical contact to the source electrode; and FIG. 11 is a top view of the semiconductor wafer shown in FIG. 10 illustrating the source and gate metallizations.

For a better understanding of the present invention together with other and further objects, advantages and capabilities thereof reference is made to the following disclosure and appended claims in connection with the above described drawings.

DETAILED DESCRIPTION OF THE INVENTION

A method for forming self-aligned first and second electrodes in a semiconductor device while avoiding the requirement for precision mask alignment and mask to mask registration is described by way of example in connection with a vertical geometry static induction transistor (SIT). The SIT includes source and drain electrodes on opposite sides of a thin, high-resistivity layer of one conductivity type and gate electrodes of the opposite conductivity type in the high resistivity layer on opposite sides of the source. For operation in the one gigahertz frequency range, it is necessary that the widths and spacing of the gate and source electrodes be on the order of a few microns.

Figure 1:
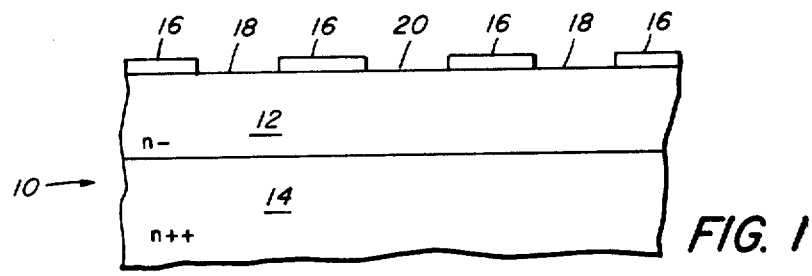
FIG. 1 is a cross-sectional view of a semiconductor wafer after opening of gate and source windows in a first oxide layer.

Referring now to FIG. 1, there is shown a partial cross-sectional view of a semiconductor wafer 10. A high resistivity epitaxial layer 12 is grown on a highly doped substrate 14 of one conductivity type. In a typical device the substrate 14 provides mechanical support and is about 200 microns in thickness while the epitaxial layer 12 is about 7 to 10 microns in thickness and has a resistivity of at least 30 ohms centimeters. Next, a silicon dioxide layer 16 is grown on the upper surface of the epitaxial layer 12. The oxide layer 16 can be formed by known methods such as exposing the semiconductor wafer 10 to an oxygen and steam ambient at about 100° C. Gate windows 18 and a source window 20 are formed in the oxide layer 16 in the next step. In a typical method of forming windows 18 and 20, a photoresist material is applied to the upper surface of the oxide layer 16, exposed through a patterned mask, and developed. The exposed portions of the oxide layer 16 are etched by a suitable solution such as buffered HD, or $NH_4$:HF, to form the windows 18 and 20. Since the gate windows 18 and the source window 20 are formed at the same time no alignment is required during this step. Gate windows 18 are in the form of elongated strips with an enlarged portion at one end thereof.

Figure 2:
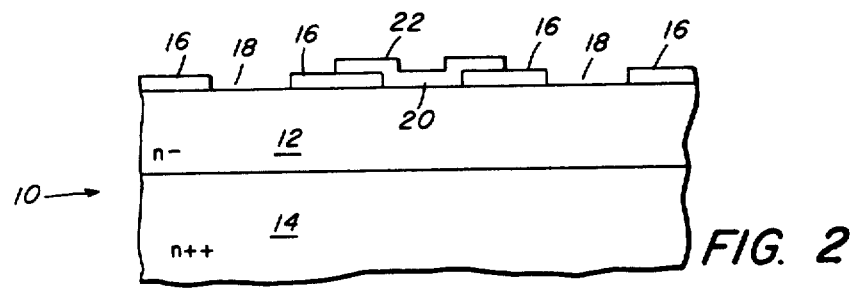
FIG. 2 is a cross-sectional view of the semiconductor wafer of FIG. 1 after deposition of a silicon nitride layer in the source window.

Referring now to FIG. 2, the semiconductor wafer 10 is shown after deposition of a silicon nitride layer 22 in the source window 20 according to the next step of the process. A typically method of forming the silicon nitride layer 22 is by chemical vapor deposition from ammonia at about 800° C. While a mask is required for patterning the silicon nitride, precision alignment of the mask is not required. The dimension of the mask aperture is made larger than the dimension of the source window 20 so that the silicon nitride layer 22 overlaps the source window 20. Overlap of the silicon nitride layer 22 is not a problem as long as it does not extend into the gate windows 18. The silicon nitride layer 22 protects the high resistivity epitaxial layer 12 beneath the source window 20 during the succeeding steps of the process.

Figure 3:
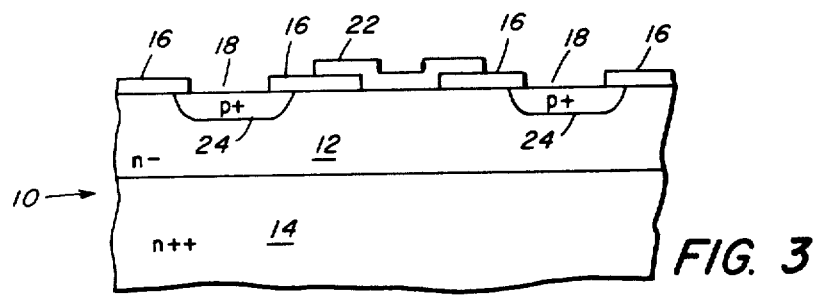
FIG. 3 is a cross-sectional view of the semiconductor wafer shown in FIG. 2 after doping of the gate electrodes.

In the next step of the process the epitaxial layer 12 is doped through the gate windows 18 to form gate electrodes 24, as shown in FIG. 3. The gate electrodes 24 can be formed by standard methods of ion implantation and drive-in diffusion or by prediffusion and drive-in diffusion. In the example of the static induction transistor, the gate electrodes 24 have low resistivity and are of the opposite conductivity type from the epitaxial layer 12. This step requires no alignment.

Figure 4:
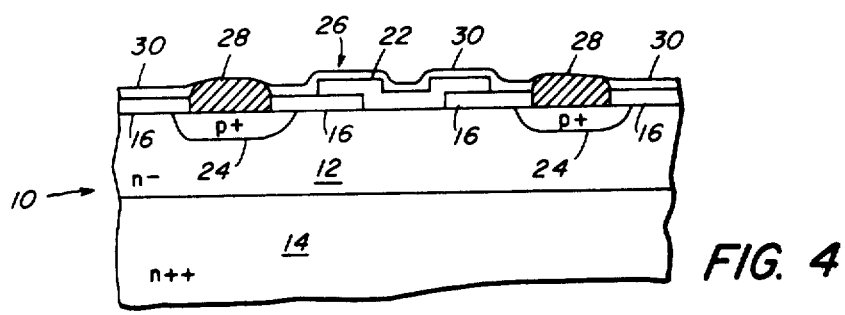
FIG. 4 is a cross-sectional view of the semiconductor wafer shown in FIG. 3 after growth of a silicon layer over the wafer.

The semiconductor wafer 10 is now introduced into an epitaxial reactor for growth of a silicon layer 26 over its top surface as shown in FIG. 4. The silicon layer 26 is grown by standard chemical vapor deposition techniques from a $SiH_4$—$H_2$ gas system at a temperature between about 950° C. and 1000° C. In the growth of the silicon layer 26, monocrystalline, or epitaxial, regions 28 are formed in the gate windows 18 as a continuation of the crystal structure of the gate electrodes 24 and are therefore in the form of elongated strips with an enlayered portion at one end thereof. A polycrystalline region 30 is formed over the remainder of the semiconductor wafer 10, including the oxide layer 16 and the silicon nitride layer 22. The monocrystalline regions 28 grow at a faster rate and become thicker than the polycrystalline region 30. Since the monocrystalline regions 28 act as the contacts to the gate electrodes 24, these regions are formed with the same conductivity type as the gate electrodes 24 and have low resistivity. In the present example, the monocrystalline regions 28 are grown to about 15,000 angstroms in thickness.

It is possible, by controlling the epitaxial growth conditions, to reduce the rate of growth of the undesired polycrystalline region 30. When the $Si_4$—$H_2$ gas system is used, growth temperatures of about 1200° C. minimize growth of the polycrystalline region 30 on $SiO_2$. However, unacceptable impurity redistribution can occur in the semiconductor wafer 10 at 1200° C. Therefore, lower temperatures are preferred. As described hereinafter, the polycrystalline region 30 can be removed by etching techniques.

The silicon layer 26 can alternatively be grown using a $SiCL_4$—HCl—$H_2$ gas system. The use of silicon chlorides with HCl was described by R. K. Smeltzer, in "Epitaxial Deposition of Silicon in Deep Grooves", J. Electrochem. Soc.: Solid State Science and Technology, 112, No. 12, p. 1666 (1975). When a silicon chloride gas system is used the growth of the polycrystalline region 30 over silicon dioxide can be reduced by controlling the concentration of HCl in the system.

Figure 5:
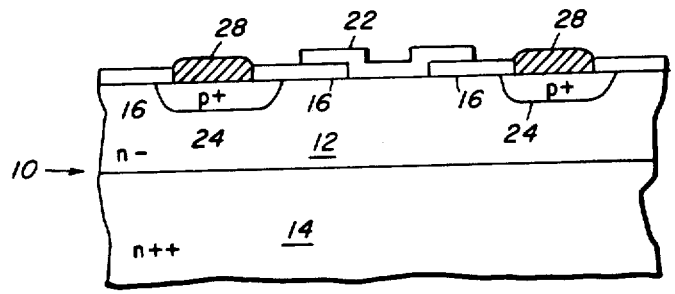
FIG. 5 is a cross-sectional view of the semiconductor wafer shown in FIG. 4 after etching of the polycrystalline portion of the silicon layer.

The silicon layer 26 is exposed in the next step to an etching solution which etches the polycrystalline region 30 at a faster rate than the monocrystalline regions 28. During this etching step the polycrystalline region 30 is removed while the monocrystalline region 28 remains, as shown in FIG. 5. One etching solution which can be used to remove the polycrystalline region 30 is buffered HF, or $NH_4F$:HF, in a ratio between 1:5 and 1:10. The buffered HF filters through the relatively porous polycrystalline region 30 and attacks the surface of the silicon dioxide layer 16, causing the polycrystalline region 30 to lift off, or peel off, the surface. No such effect occurs in the monocrystalline regions 28. An alternative mixture, which operates by selective etching rather than lift-off, is potassium hydroxide and n-propanol. In selective etching, the polycrystalline region 30 is etched at a higher rate than the monocrystalline regions 28. Another selective etching mixture is ethylenediamine, catechol and water. One suitable example of this mixture is 46.4 mole % ethylenediame, 4.2 mole % catechol, and 49.4 mole % water and an etching temperature of about 80° C. is used.

Figure 6:
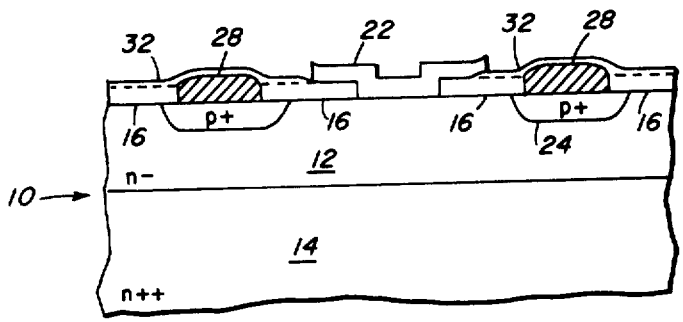
FIG. 6 is a cross-sectional view of the semiconductor wafer shown in FIG. 5 after growth of a second oxide layer.

After the polycrystalline region 30 of the silicon layer 26 has been removed, a second oxide layer 32 is grown over the surface of the semiconductor wafer 10 as shown in FIG. 6. In reality, the oxide layer 32 is a continuation of the growth of the oxide layer 16. However, the oxide layer 32 is separately identified in FIG. 6 for purposes of clarity. The oxide layer 32 does not grow over the silicon nitride layer 22 but lifts the edges of the silicon nitride layer 22 by a small amount as is known in the art. To avoid impurity redistribution in the semiconductor wafer 10, a low temperature, high-pressure oxidation process is utilized. Typically, a temperature of about 950° C. and a pressure of about 10 atmospheres are used for growth of the oxide layer 32.

Figure 7:
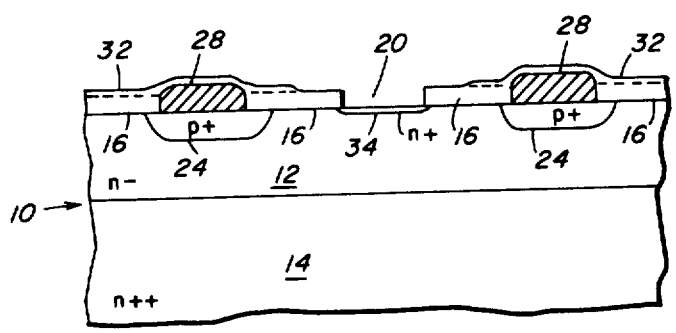
FIG. 7 is a cross-sectional view of the semiconductor wafer shown in FIG. 6 after etching of the silicon nitride layer and doping of the source electrode.

The silicon nitride layer 22 is then stripped off the wafer 10 to provide access to the source window 20, as shown in FIG. 7. The silicon nitride layer 22 can be removed by known methods such as exposure to phosphoric acid at about 80° C. or plasma etching. In this step, the oxide layers 16 and 32 are left intact. Next, a thin source electrode 34 is formed by ion implantation or diffusion of impurities. In the static induction transistor, the source electrode 34 has low resistivity and is of the same conductivity type as the epitaxial layer 12.

A partial top view of the semiconductor wafer 10 is shown in FIG. 8. The monocrystalline regions 28 which cover the gate electrodes 24 are in the form of elongated strips and are buried under the oxide layer 32. The monocrystalline regions 28 include enlarged portions 36 at one end thereof. In the next step of the process of the present invention, gate contact windows 38 are opened in the oxide layers over the enlarged portions 36 utilizing the process described hereinabove in connection with the opening of windows 18 and 20. The use of enlarged portions 36 obviates the requirement for precision mask alignment in this step.

Figure 9:
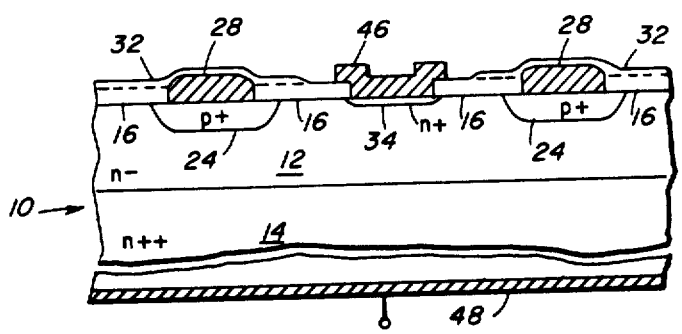
FIG. 9 is a cross-sectional view of the semiconductor wafer shown in FIG. 8.

In a metallization step, metallic gate and source contacts are deposited and patterned. A gate contact 40 includes fingers 42, which extend over the gate contact windows 38 for making electrical contact to the monocrystalline regions 28, and a relatively large region for external lead attachment. A source contact 44 includes a finger 46, as shown in FIGS. 8 and 9, in the source window 20, for making electrical contact to the source electrode 34, and a relatively large region for external lead attachment. The metallic contacts are typically made by sputtering of aluminum including 2% silicon. An appropriate mask produces the metallic contact patterns. While the metallization mask requires reasonably precise alignment to ensure proper placement of the source contact 44, a small misalignment of the source contact 44 does not seriously degrade the performance of the static induction transistor. Mask alignment is also less critical with respect to the gate contact 40 since the device dimensions are larger in the region of the gate contact windows 38 than in the elongated strip portions of the monocrystalline regions 28.

It is to be understood that FIGS. 1-9 illustrate only a portion of the semiconductor wafer 10. A complete static induction transistor typically includes multiple source electrodes in an array of parallel strips. Parallel gate electrodes are located between each pair of source electrodes. The source electrodes and gate electrodes, respectively, are connected in parallel to form a device with the desired power handling capability.

The completed SIT with low capacitance self-aligned gate electrodes is illustrated in FIGS. 8 and 9. An ohmic contact 48 is attached to the bottom surface of the substrate 14 and constitutes the drain contact for the device. By way of specific example, a high frequency SIT can be fabricated with the substrate 14 having a resistivity of about 0.01 ohm centimeter, the high resistivity layer 12 having a resistivity of at least 30 ohm centimeters, the gate electrodes 24 having a impurity surface concentration of $10^{18}$cm$^{-3}$, the monocrystalline regions 28 having a resistivity of less than 0.1 ohm centimeters, and the source electrode having a resistivity of less than 0.1 ohm centimeter. Gate and source electrodes are typically 1.5 to 2.5 microns in width and are spaced apart by 4 to 5 microns. Gate and source electrode depths are typically 2.5 to 3 microns and 0.3 microns, respectively. Further details regarding the construction and operation of static induction transistors are disclosed by Nishizawa et al in U.S. Pat. Nos. 3,828,230 and 4,199,771; by Nishizawa et al in "Field Effect Transistor Versus Analog Transistor (Static Induction Transistor)," *IEEE Transactions on Electron Devices*, Vol. ED-22, No. 4, April 1975; and Nishizawa et al in "High Frequency High Power Static Induction Transistors," *IEEE Transactions on Electron Devices*, Vol. ED-25, No. 3, March 1978.

In an alternative approach, the source contact is formed as a monocrystalline silicon region over the source electrode, as shown in FIGS. 10 and 11. The device is fabricated in the manner described hereinabove up to and including the step of stripping the silicon nitride layer 22. Then a second silicon layer, having the same conductivity type as the epitaxial layer 12 but having very low resistivity, is grown over the semiconductor wafer 10, as described hereinabove in connection with the silicon layer 26. The second silicon layer includes a monocrystalline region 50 over the source electrode 34 and a polycrystalline region (not shown) over the remainder of the semiconductor wafer 10. The second silicon layer is then exposed to an etching solution which removes the polycrystalline region but does not attack the monocrystalline region 50. Suitable etching solutions are described hereinabove. After etching of the second silicon layer, a protective oxide layer 52 is grown over the semiconductor wafer 10. During the oxidation step, the source electrode 34 is formed by outdiffusion from the highly doped region 50.

The monocrystalline region 50 which covers the source electrode 34 includes an enlarged portion 54 at one end thereof as illustrated in FIG. 11. Gate contact windows 38 and source contact windows 56 are opened in the oxide layers over the enlarged portions 36 and 54, respectively, utilizing the process described hereinabove in connection with the opening of windows 18 and 20. Because of the relatively large dimensions of the enlarged portions 36 and 54, precision mask alignment is not required.

A metallic gate contact 40 includes fingers 42, which make electrical contact to the monocrystalline regions 28, and a larger region for lead attachment, as described hereinabove. A metallic source contact 58 includes a finger 60, which extends over the source contact window 56 for making electrical contact to the monocrystalline region 50, and a larger region for lead attachment. The contacts 40 and 58 are made by sputtering of aluminum including 2% silicon. An appropriate mask produces the metallic contact patterns. Since the metallic contacts are aligned only with the enlarged portions 36 and 54, precision alignment of the metallization mask is not required.

The completed SIT with low capacitance self-aligned gate and source electrodes, as illustrated in FIGS. 10 and 11, can have the parameters of the device shown in FIGS. 8 and 9 and described hereinabove. The monocrystalline region 50 can have a resistivity of less than 0.1 ohm centimeter.

Thus, there is provided by the present invention an electrode structure in which the parasitic capacitance associated with metallic contact window overlap is reduced. The reduced in contact window overlap by metallic contacts results in a significant reduction in parasitic capacitance and an improvement in high frequency device performance. Furthermore, there is provided a method for fabricating closely spaced electrodes in a high frequency semiconductor device while avoiding the requirement for precision mask alignment and mask to mask registration.

While there has been shown and described what is at present considered the preferred embodiments of the invention, it will be obvious to those skilled in the art that various changes and modifications may be made therein without departing from the scope of the invention as defined by the appended claims.

What is claimed is:

1. A method for forming self-aligned gate and source electrodes in a static induction transistor while avoiding the requirement for precision mask alignment and mask to mask registration, said method comprising the steps of:

growing a first oxide layer over a high resistivity epitaxial silicon layer on a semiconductor wafer;

masking and opening gate and source windows in said first oxide layer said gate windows in the form of elongated strips with an enlarged portion at one end thereof;

masking and depositing a protective silicon nitride layer in said source window and not in said gate window;

doping said high resistivity epitaxial silicon layer through said gate window thereby forming said gate electrode;

placing said wafer in an epitaxial reactor in which a low resistivity silicon layer of the same conductivity type as said gate electrode is grown over said wafer, said low resistivity silicon layer growing as a monocrystalline region over in the form of elongated strips with an enlarged portion at each end over said gate electrode and as a polycrystalline region over said first oxide layer and said silicon nitride layer;

exposing said wafer to a first etching solution which removes said polycrystalline region but which has little effect on said monocrystalline region;

growing a second oxide layer on said wafer under low temperature, high-pressure conditions;

exposing said wafer to a second etching solution which removes said silicon nitride layer from said source window without affecting said oxide layers;

doping said high resistivity epitaxial silicon layer through said source window thereby forming said source electrode;

masking and opening a gate contact window through said second oxide layer to said enlarged portion of said monocrystalline region; and masking and depositing metal over said gate contact window and said source electrode for making electrical contact to said source and gate electrodes.

2. The method as defined in claim 1 wherein said low resistivity silicon layer is grown at a temperature between about 950° C. and 1000° C.

3. The method as defined in claim 1 wherein said first etching solution includes $NH_4F:HF$ in a ratio between 1:5 and 1:10, said first etching solution being operative to lift said polycrystalline region off said wafer.

4. The method as defined in claim 1 wherein said monocrystalline region is between 0.5 and 1.5 microns in thickness.

* * * * *